United States Patent
Kopp et al.

(10) Patent No.: US 10,381,515 B2
(45) Date of Patent: Aug. 13, 2019

(54) OPTOELECTRONIC SEMICONDUCTOR CHIP AND METHOD OF PRODUCING AN OPTOELECTRONIC SEMICONDUCTOR CHIP

(71) Applicant: OSRAM Opto Semiconductors GmbH, Regensburg (DE)

(72) Inventors: Fabian Kopp, Penang (MY); Attila Molnar, Galugor (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/939,487

(22) Filed: Mar. 29, 2018

(65) Prior Publication Data

US 2018/0287011 A1 Oct. 4, 2018

(30) Foreign Application Priority Data

Mar. 30, 2017 (DE) .................. 10 2017 106 915

(51) Int. Cl.
| | |
|---|---|
| *H01L 33/14* | (2010.01) |
| *H01L 33/40* | (2010.01) |
| *H01L 33/50* | (2010.01) |
| *H01L 33/38* | (2010.01) |
| *H01L 33/46* | (2010.01) |
| *H01L 33/20* | (2010.01) |
| *H01L 33/44* | (2010.01) |

(52) U.S. Cl.
CPC .......... *H01L 33/145* (2013.01); *H01L 33/382* (2013.01); *H01L 33/405* (2013.01); *H01L 33/46* (2013.01); *H01L 33/50* (2013.01); *H01L 33/20* (2013.01); *H01L 33/44* (2013.01)

(58) Field of Classification Search
CPC ..... H01L 33/145; H01L 33/382; H01L 33/46; H01L 33/50; H01L 33/405; H01L 33/20; H01L 33/44

See application file for complete search history.

(56) References Cited

FOREIGN PATENT DOCUMENTS

| | | |
|---|---|---|
| DE | 10 2015 107 577 A1 | 11/2016 |
| DE | 10 2016 105 056 A1 | 9/2017 |

*Primary Examiner* — Anthony Ho
(74) *Attorney, Agent, or Firm* — DLA Piper LLP (US)

(57) ABSTRACT

An optoelectronic chip includes a semiconductor layer sequence including at least one n-doped semiconductor layer, at least one p-doped semiconductor layer, an active layer arranged between the at least one n-doped semiconductor layer and the at least one p-doped semiconductor layer, wherein the p-doped semiconductor layer is electrically contacted by a p-connection contact, the n-doped semiconductor layer is electrically contacted by an n-connection contact, the semiconductor chip has at least two trenches, the p-connection contact is located within the first trench and the n-connection contact is located within the second trench, below the p-connection contact and within the first trench a first dielectric mirror element is arranged, which is electrically insulated, and below the n-connection contact and within the second trench and between the n-connection contact and the n-doped semiconductor layer, a second dielectric mirror element is arranged at least in regions, the second dielectric mirror element being electrically insulated.

15 Claims, 10 Drawing Sheets

A)

B)

C)

D)

A)

B)

C)

A)

B)

C)

A)

B)

OPTOELECTRONIC SEMICONDUCTOR CHIP AND METHOD OF PRODUCING AN OPTOELECTRONIC SEMICONDUCTOR CHIP

TECHNICAL FIELD

This disclosure relates to an optoelectronic semiconductor chip and a method of producing an optoelectronic semiconductor chip.

BACKGROUND

In optoelectronic semiconductor chips such as LED chips, for example, dielectric mirror elements can generally be mounted below metallic connection contacts to prevent direct current flow into the semiconductor layer sequence. For example, an LED chip can be a sapphire volume emitter. The LED chip can preferably emit blue light. Metallic connecting contacts that inject a current into the semiconductor layer sequence are generally applied to the top side of the sapphire chip. Additional layers such as, for example, dielectric mirror elements can be arranged between the metallic connection contacts and the semiconductor layer sequence. These additional layers can increase the reflection coefficient of the metallic connection contacts. In general, the higher the reflection coefficient of the metallic connection contacts, the lower the absorption per area of the metallic connection contact. The brightness loss can thus be reduced. Production of these additional layers between the metallic connection contacts and the semiconductor layer sequences also means, however, new process complexity and thus costs.

It could therefore be helpful to provide an optoelectronic semiconductor chip having a high reflection that is produced inexpensively as well as a method of producing an optoelectronic semiconductor chip that produces the optoelectronic semiconductor chip in a favorable and rapid manner.

SUMMARY

We provide an optoelectronic semiconductor chip including a semiconductor layer sequence including at least one n-doped semiconductor layer, at least one p-doped semiconductor layer, an active layer arranged between the at least one n-doped semiconductor layer and the at least one p-doped semiconductor layer, wherein the p-doped semiconductor layer is electrically contacted by a p-connection contact, the n-doped semiconductor layer is electrically contacted by an n-connection contact, the semiconductor chip has at least two trenches, the p-connection contact is located within the first trench and the n-connection contact is located within the second trench, below the p-connection contact and within the first trench a first dielectric mirror element is arranged, which is electrically insulated, and below the n-connection contact and within the second trench and between the n-connection contact and the n-doped semiconductor layer, a second dielectric mirror element is arranged at least in regions, the second dielectric mirror element being electrically insulated.

We also provide a method of producing the optoelectronic semiconductor chip including a semiconductor layer sequence including at least one n-doped semiconductor layer, at least one p-doped semiconductor layer, an active layer arranged between the at least one n-doped semiconductor layer and the at least one p-doped semiconductor layer, wherein the p-doped semiconductor layer is electrically contacted by a p-connection contact, the n-doped semiconductor layer is electrically contacted by an n-connection contact, the semiconductor chip has at least two trenches, the p-connection contact is located within the first trench and the n-connection contact is located within the second trench, below the p-connection contact and within the first trench a first dielectric mirror element is arranged, which is electrically insulated, and below the n-connection contact and within the second trench and between the n-connection contact and the n-doped semiconductor layer, a second dielectric mirror element is arranged at least in regions, the second dielectric mirror element being electrically insulated including A) providing a semiconductor layer sequence with trenches including at least one n-doped semiconductor layer, at least one p-doped semiconductor layer and an active layer arranged between the at least one n-doped semiconductor layer and the at least one p-doped semiconductor layer, wherein the first trench designed contains a first dielectric mirror element and a p-connection contact, and the second trench designed contains a second dielectric mirror element and an n-connection contact, B) applying the first and second dielectric mirror elements and a current spreading structure into the first and second trenches by lithography, C) at least partially removing the current spreading structure within the second trench, and D) applying the p-connection contact in the first trench and the n-connection contact into the second trench.

Figure 1:
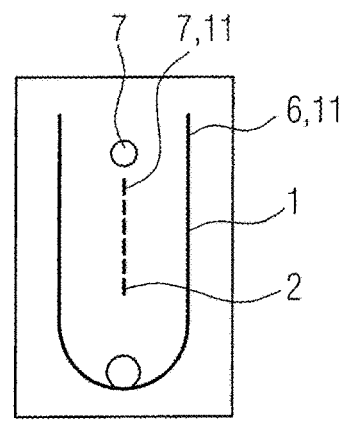
FIGS. 1A to 1C show a method of producing an optoelectronic semiconductor chip.
Figure 1:
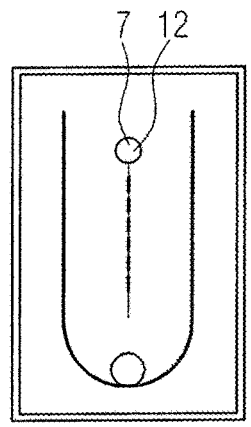
Figure 1:
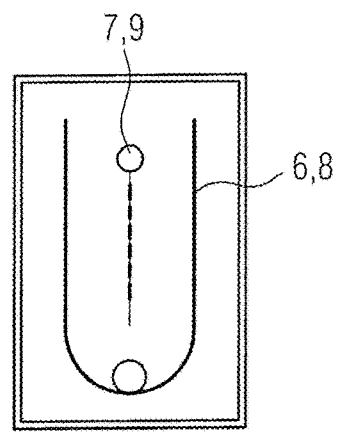

LIST OF REFERENCE NUMERALS 100 optoelectronic semiconductor chip
10 semiconductor layer sequence
1 first dielectric mirror element
2 second dielectric mirror element
210 first (part) layer of the first or second dielectric mirror element
220 second (part) layer of the first or second dielectric mirror element
230 third (part) layer of the first or second dielectric mirror element
2 second dielectric mirror element
3 n-doped semiconductor layer
31 first side surface
32 second side surface
4 active layer
5 p-doped semiconductor layer
6 first trench
61 side surface of the first trench
62 base surface of the first trench
7 second trench
71 side surface of the second trench
72 base surface of the second trench
8 p connection contact 9 n connection contact
11 current spreading structure
12 third trench
13 passivation layer
14 sacrificial layer
15 substrate
16 first recess
17 second recess
T1, T2 heights of the trenches

DETAILED DESCRIPTION

The optoelectronic semiconductor chip has a semiconductor layer sequence. The semiconductor layer sequence has at least one n-doped semiconductor layer, at least one p-doped semiconductor layer and an active layer arranged between the at least one n-doped semiconductor layer and the at least one p-doped semiconductor layer. The p-doped semiconductor layer is electrically contacted by a p-connection contact. The n-doped semiconductor layer is electrically contacted by an n-connection contact. The semiconductor chip has at least two trenches. In particular, the two trenches extend at least within the semiconductor layer sequence. The p-connection contact extends within the first trench and/or the n-connection contact extends within the second trench. In particular, the p-connection contact extends at least in regions within the first trench and/or the n-connection contact extends at least in regions within the second trench. A first dielectric mirror element is arranged below the p-connection contact and within the first trench. The dielectric mirror element is in particular electrically insulating or has an electrically insulating effect. A second dielectric mirror element is arranged at least in regions below the n-connection contact and within the second trench and/or between the n-connection contact and the n-doped semiconductor layer. The second dielectric mirror element is in particular electrically insulating or has an electrically insulating effect.

The semiconductor chip may comprise at least one semiconductor layer sequence. The semiconductor layer sequence has at least one n-doped semiconductor layer, at least one p-doped semiconductor layer and an active layer arranged between the at least one n-doped semiconductor layer and the at least one p-doped semiconductor layer. The semiconductor layers of the semiconductor chip are preferably based on a III-V compound semiconductor material. The semiconductor material can preferably be based on a nitride compound semiconductor material. "Based on a nitride compound semiconductor material" means that the semiconductor layer sequence or at least one layer thereof comprises a III nitride compound semiconductor material, preferably $In_xAl_yGa_{1-x-y}N$, wherein $0 \leq x \leq 1$, $0 \leq y \leq 1$ and $x+y \leq 1$. In this case, this material does not necessarily have to have a mathematically exact composition according to the above formula. Rather, it can have one or more dopants and additional constituents that substantially do not change the characteristic physical properties of the $In_xAl_yGa_{1-x-y}N$-material. For the sake of simplicity, however, the above formula only contains the essential constituents of the crystal lattice (In, Al, Ga, N), even if they can be partially replaced by small quantities of other substances.

The n-doped semiconductor layer may be electrically contacted by an n-connection contact. In other words, the n-connection contact forms the n-contact of the optoelectronic semiconductor chip. The n-connection contact can have, for example, a bonding pad or one or more contact webs.

The p-connection contact can in particular be arranged at least in regions within the first trench or completely within the second trench. For example, the p-connection contact, viewed in the lateral cross-section, cannot project beyond the first trench and/or have the same height as the first trench.

The n-connection contact can in particular be arranged at least in regions within the second trench or completely within the second trench. For example, the n-connection contact, viewed in the lateral cross-section, cannot project beyond the second trench and/or have the same height as the second trench.

The first and/or second trench/es may extend/s at least partially into the p-doped semiconductor layer. In particular, the first and/or second trench/es extend/s from the p-doped semiconductor layer via the active layer into the n-doped semiconductor layer. The fact that the first and/or second trench/es extend/s at least partially into the corresponding semiconductor layer means that at least one partial region, in particular the base surface of the trench, projects into the corresponding semiconductor layer. In particular, the first and/or second trench/es can extend to a substrate, on which the p-doped and n-doped semiconductor layers are arranged. In particular, the first and/or second trench/es extend/s to the substrate. For example, the first and/or second trench/es extend/s into the substrate up to a maximum of 5 μm.

The first and/or second trench/es can have a depth of greater than or equal to 50 nm and less than or equal to 15 μm. The trench/es extend/s into the n-doped semiconductor layer, thus, the first and/or second trench/es can have a depth of 100 nm to 3000 nm. The first and/or second trench/es extend/s to the substrate, thus, the first and/or second trench/es can have a depth of 6 to 15 μm, for example, 9 μm. A first trench means a recess in the optoelectronic semiconductor chip having a width-to-length ratio of at least 1:5, in particular 1:15 or 1:30. The trench can be produced by dry etching in the semiconductor layer sequence. A second trench means a recess in the optoelectronic semiconductor chip having a width in particular of 5 μm to 20 μm and/or a length of 100 μm to 700 μm. The second trench can have a width-to-length ratio of 1:5 to 1:35, for example, 1:20 or 1:35.

In particular, the first and/or second trench is a mesa trench, that is to say a trench etched deeper into the n-type semiconductor layer.

The p-connection contact and/or n-connection contact may have/has a maximum height in cross section. In particular, the p- and/or n-connection contact/s are/is arranged within the first and/or second trench/es up to half of their/its maximum height, in particular up to ⅔ of their/its maximum height, and are/is arranged in the corresponding trench. In other words, the n- and/or p-connection contact/s protrude/s from the respective trench to a maximum of ½ to ⅓ of their/its maximum height. In particular, the p- and/or n-connection contact/s are/is arranged completely within the first and/or second trench/es. This has the effect that the p- and/or n-connection contact/s in the first and/or second trench/es can thus be protected from mechanical damage during production.

Alternatively, the p- and/or n-connection contact/s can have a maximum height when viewed in the lateral cross-section, wherein the p- and/or n-connection contact/s protrude/s beyond the first and/or second trench/es up to a maximum of ⅔ of this maximum height.

The semiconductor chip may have a current spreading structure. The current spreading structure is arranged in particular between the p-connection contact and the first dielectric mirror element. Alternatively or additionally, the current spreading structure is arranged, in particular at least in regions, between the n-connection contact and the second dielectric mirror element. The current spreading structure is in particular a transparent electrically conductive layer. In particular, the transparent electrically conductive layer is in direct electrical contact with the p-doped semiconductor layer and/or the p-connection contact or with the n-doped semiconductor layer and the n-connection contact. "Direct" means that the layers or elements are arranged in direct mechanical and/or electrical contact on the other layer or the other element.

In particular, the current spreading structure extends in the lateral direction within the first and/or second trench/es, thus covering the side surfaces and the base surface of the first and/or second trench/es completely. In particular, the current spreading structure is arranged above the first and/or second dielectric mirror element/s, in particular directly. In this way, a current distribution in the lateral direction can be effected by the current spreading structure.

The current spreading structure can be transmissive to emitted radiation. The current spreading structure preferably contains a transparent conductive oxide (TCO), for example, ITO.

Transparent, electrically conductive oxides (TCOs) are transparent, electrically conductive materials, generally metal oxides such as, for example, zinc oxide, tin oxide, cadmium oxide, titanium oxide, indium oxide, indium tin oxide (ITO) or aluminum zinc oxide (AZO). In addition to binary metal-oxygen compounds such as ZnO, $SnO_2$ or $In_2O_3$, they also include ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides of the group of TCOs. Furthermore, the TCOs do not necessarily correspond to a stoichiometric composition and can also be p- or n-doped.

The first dielectric mirror element and the current spreading structure may each be formed as a layer. Viewed in the lateral cross-section, the first dielectric mirror element and the current spreading structure cover both the side surfaces as well as the base surface of the first trench, in particular completely. The layer of the first dielectric mirror element preferably has a homogeneous layer thickness in regions, in particular transversely to the growth direction of the semiconductor layer sequence. In the region of the flanks of the pyramidal configuration, the layer thickness of the first dielectric mirror element can be smaller than the layer thickness of the first or second dielectric mirror element arranged transversely to the growth direction of the semiconductor layer sequence. "Homogeneous layer thickness" means a layer thickness of the first dielectric mirror element having an average layer thickness with a maximum deviation of 10%, 5%, 3%, 1%, 0.5% or 0.1% of this average value.

The second dielectric mirror element may be formed as a layer. Viewed in the lateral cross-section, the second dielectric mirror element covers both the side surfaces and base area of the second trench, in particular completely. The layer thickness of the layer of the second dielectric mirror element is in particular smaller in the region below the n-connection contact and on the base area than the layer thickness of the layer of the second dielectric mirror element on the side surfaces of the second trench. In other words, the second dielectric mirror element does not have a continuously homogeneous layer thickness. In particular, below the n-connection contact, the layer thickness of the second dielectric mirror element is reduced. This can be effected by an etching process, that is to say by removing part of the second dielectric mirror element.

The n-doped semiconductor layer may be arranged in a roof-shaped manner within the second trench. Viewed in the lateral cross section, the n-doped semiconductor layer is shaped in a triangular manner within the second trench. A side face of the roof-shaped configuration is covered in particular with the second dielectric mirror element. A roof-shaped configuration can also mean that the n-doped semiconductor layer is formed in the shape of a pyramid.

The side surface not covered by the second dielectric mirror element may be in direct contact with the n-connection contact.

The side face of the pitched roof-shaped configuration covered by the second dielectric mirror element may be larger than the further side face of the roof-shaped configuration. In this case, "further side face" means the side face of the pitched roof not covered by the second dielectric mirror element.

The first and/or second trench/es may have/has an angle v between the base surface and at least one side surface of greater than 110°, in particular greater than 115° and preferably greater than 120°.

The first dielectric mirror element and/or the second dielectric mirror element may have/has at least three layers. The at least one first dielectric layer has a first dielectric material having a refractive index $n1$. The at least one second dielectric layer has a second dielectric material having a refractive index $n2>n1$.

The first dielectric material advantageously has a low refractive index, preferably $n1<1.7$, and the second dielectric material has a high refractive index $n2>1.7$, preferably $n2>2$. The first and/or second dielectric mirror element/s function/s as an interference layer system, the reflection-increasing effect of which is based on multiple reflections at the interfaces between the dielectric layers having the different refractive indices $n1$, $n2$.

Advantageously, the active layer is suitable to emit radiation having a dominant wavelength $\lambda$, wherein for the thickness $d1$ of the at least one first dielectric layer $0.01\ \lambda/4 \leq n1*d1 \leq 10\ \lambda/4$ and for the thickness $d2$ of the at least one second dielectric layer $0.01\ \lambda/4 \leq n2*d2 \leq 10\ \lambda/4$. Preferably $0.5\ \lambda/4 \leq n1*d1 \leq 5\ \lambda/4$ and $0.5\ \lambda/4 \leq n2*d2 \leq 5\ \lambda/4$.

Alternatively, the first and/or second dielectric mirror element/s can have at least three layers, wherein the at least one first dielectric layer forms the bottommost layer, that is to say the layer of the first and/or second dielectric mirror element arranged directly downstream of the corresponding semiconductor layer. The following applies to the thickness $d1$ of the first dielectric layer: $n1*d1=3\ \lambda/4$ or $n1*d1=5\ \lambda/4$; for the subsequent layers, for example, for the second dielectric layer, the following applies to the thickness $d2$: $n2*d2=1\ \lambda/4$.

Preferably, $0.7\ \lambda/4 \leq n1*d1 \leq 1.3\ \lambda/4$ applies to the thickness of the at least one first dielectric layer and $0.7\ \lambda/4 \leq n2*d2 \leq 1.3\ \lambda/4$. In this case, the optical thickness $n1*d1$ of the first dielectric layer and the optical thickness $n2*d2$ of the second dielectric layer are approximately equal to a quarter of the dominant wavelength. This is a way of achieving high reflection by interference in the first and/or second dielectric mirror element/s.

The first and/or second dielectric mirror element/s may be formed as a single layer.

The first dielectric mirror element and/or the second dielectric mirror element may comprise at least one of the following materials, $Al_2O_3$, $Ta_2O_5$, $ZrO_2$, $ZnO$, $SiN_x$, $SiO_xN_y$, $SiO_2$, $TiO_2$, $ZrO_2$, $HfO_2$, $Nb_2O_5$ or $MgF_2$ or combinations thereof.

The first dielectric mirror element and/or the second dielectric mirror element may have a layer sequence with alternating layers of silicon dioxide and titanium dioxide. In other words, the first and/or second dielectric mirror element/s are/is formed as a so-called distributed bragg reflector (DBR). A DBR mirror can have a periodic sequence of layer pairs, each having a first dielectric layer having a refractive index n1 and a second dielectric layer having a refractive index n2>n1. With this concept, the layer thickness of the first and/or second dielectric mirror element/s is not limited since an overshaping of a subsequent transparent electrically conductive layer is not critical. The first and/or second dielectric mirror element/s, optionally including a metal layer, preferably have/has a reflectance of greater than or equal to 70%, preferably greater than or equal to 90%, for example, 95%.

The first dielectric mirror element and the second dielectric mirror element may have the same material or the same materials.

A direct current flow between the p-connection contact or n-connection contact and the p- and/or n-doped semiconductor layer sequences and the active layer may be prevented by the first dielectric mirror element and/or the second dielectric mirror element. In other words, a direct current flow through the first dielectric mirror element between the p-connection contact and the semiconductor layer sequence is prevented. The second dielectric mirror element prevents direct current flow between the n-connection contact and the semiconductor layer sequence.

We recognized that, by arrangement of the metallic connecting contacts within the first and the second trench, advantageous properties of the semiconductor chips can be produced. In particular, the first dielectric mirror element is arranged below the p-connection contact and within the first trench. The first dielectric mirror element is formed as a highly reflective DBR.

The second dielectric mirror element is arranged at least in regions below the n-connection contact. "At least in regions" means that a current flow between the n-connection contact and the n-doped semiconductor layer sequence is made possible. The second dielectric mirror element is formed in particular as a highly reflective DBR. At the transition between the respective dielectric mirror element and the metallic connection contact surfaces, particularly pitched roof-shaped configurations are used, preferably mesa-shaped pyramids. The mesa-shaped pyramids are formed by the n-connection contact.

We further provide a method of producing an optoelectronic semiconductor chip. The method preferably produces our optoelectronic semiconductor chip. In particular, all examples and definitions which describe the semiconductor chip are also to be used for the method and vice versa.

The method may comprise the steps of:
A) Providing a semiconductor layer sequence with trenches. The semiconductor layer sequence has at least one n-doped semiconductor layer, at least one p-doped semiconductor layer and an active layer arranged between the at least one n-doped semiconductor layer and the at least one p-doped semiconductor layer. The semiconductor chip has a first trench designed to contain a first dielectric mirror element and a p-connection contact. The second trench is designed to contain a second dielectric mirror element and an n-connection contact.

The method further comprises a step B), applying the first and second dielectric mirror elements and a current spreading structure into the first and second trenches by lithography. In other words, the current spreading structure and the first and/or second dielectric mirror element/s are/is preferably applied over the whole area to the semiconductor layer sequence formed with trenches.

In a further method step C), the current spreading structure can be removed at least in regions within the second trench.

In step D), which in particular is carried out subsequently, the p-connection contact can be applied in the first trench and the n-connection contact can be applied in the second trench.

A further, third trench is produced within the second trench by step C). The third trench is preferably produced by etching methods.

We recognized that a semiconductor chip can be produced with little effort by our method, in particular if only the steps described here, i.e., steps A) to D), are carried out. This leads to a semiconductor chip having a high reflection coefficient at the metallic connection contacts.

Additionally or alternatively, the p-connection contact and the p-bonding pad can be hidden within the first trench, wherein the side surfaces of the first trench are covered with the first dielectric mirror element. Preferably, gold side walls of the n-connection contact are also covered here, which leads to a reduction in light losses during production.

The semiconductor layer sequence may have a first trench, within which the first dielectric mirror element and/or a p-bonding pad and/or a p-connection contact is arranged. The first dielectric mirror element can be produced by lithography, in particular using a mask. In this production, the first dielectric mirror element can cover all side surfaces of the first trench. The semiconductor layer sequence can preferably consist of an n-doped gallium nitride, a p-doped gallium nitride and an active zone. In other words, the side surfaces of the first trench are produced, which are composed of partial regions of the n-doped gallium nitride layer, p-doped gallium nitride layer and the active zone.

The first and/or second dielectric mirror element are/is formed in an electrically insulating manner. In particular, the first and/or second dielectric mirror element are/is formed as a so-called DBR (distributed bragg reflector). The first and/or second dielectric mirror element preferably have/has at least one layer. The layer can have a refractive index of less than 1.7 or of greater than 1.7.

The layer thickness is in particular $\lambda/4$, wherein the first layer can have a layer thickness of $3\times\lambda/4$. A dielectric layer can additionally be applied on the first and/or second dielectric mirror element/s. The layer can be an etching stop layer or a sacrificial layer, which protects the first and/or second dielectric mirror element/s on the corresponding side surfaces of the first and/or second trench/es. For example, aluminum oxide can be applied as an etch stop layer having a layer thickness of, for example, greater than 10 nm and/or titanium dioxide as a sacrificial layer having a layer thickness of, for example, greater than 100 nm.

On the first and/or second dielectric mirror element/s and optionally the p-doped semiconductor layer, for example, p-GaN, a current spreading structure, for example, made of ITO can be applied. The current spreading structure is set up for the purpose of laterally distributing the current and thus increasing the current transport from the metallic connecting contacts and into the corresponding semiconductor layer.

The voltage distribution of the metallic connecting contacts in the current spreading structure, in particular at the p-side, is influenced by the angle between the base surface and the side surface of the corresponding trenches. A flat angle generally significantly reduces the stress distribution. In particular, the angle between the base surface and the side surface of the first and/or second trench/es can be greater than 110°, preferably greater than 115°, particularly preferably greater than 120°.

A second dielectric mirror element is arranged at least in regions below the n-connection contact. The second dielectric mirror element and the n-connection contact are preferably arranged within the second trench. In particular, the n-connection contact is in direct mechanical and/or electrical contact with the n-doped semiconductor layer.

The semiconductor chip can have a passivation layer. The passivation layer can, for example, be formed from silicon dioxide. The passivation layer is preferably opened in the region of the metallic connection contacts so that the metallic connecting contacts can be applied in this opened region in a later method step. This process step can also be absent so that costs for this additional passivation layer can be saved.

Further advantages, advantageous construction and developments will become apparent from the examples described below in conjunction with the figures.

In the examples and figures, identical or identically acting elements can each be provided with the same reference symbols. The elements illustrated and their size relationships among one another are not to be regarded as true to scale. Rather, individual elements such as, for example, layers, components and regions, are represented with an exaggerated size for better representability and/or for a better understanding.

FIGS. 1A to 1C show a method of producing an optoelectronic semiconductor chip according to an example.

A semiconductor layer sequence 10 is provided (not shown here). The semiconductor layer sequence has at least one n-doped semiconductor layer 3, at least one p-doped semiconductor layer 5 and an active layer 4 arranged between the at least one n-doped semiconductor layer and the at least one p-doped semiconductor layer (semiconductor layer sequence is not shown in detail). Trenches, in particular at least two trenches 6, 7, are arranged in the semiconductor layer sequence. The first trench 6 receives or contains a first dielectric mirror element 1 and a p-connection contact 8. The first trench 6 is preferably formed in a U-shape manner in a plan view of the semiconductor chip. The second trench 7 preferably receives or contains a second dielectric mirror element 2 and an n-connection contact. The second trench 7 is preferably formed in a circular shape. Additionally or alternatively, the second trench can be formed as a zebra-like strip structure.

The first and the second trenches 6, 7 can be produced by lithography and use of a mask in the semiconductor layer sequence 10. The first and/or second trench/es 6, 7 can be produced by an etching method. Subsequently, a material can be applied over the whole area to the first and/or second trench/es. The material can be a dielectric material. As a result, a first dielectric mirror element 1 is formed in the first trench 6 and a second dielectric mirror element 2 is formed in the second trench 7. The mask, which is, for example, a photoresist mask, can subsequently be removed again (FIG. 1A)

Subsequently, a current spreading structure 11 can be applied (not shown here). The current spreading structure 11 is applied preferably on the whole area, that is to say both in the first trench 6 and in the second trench 7. The current spreading structure can subsequently be heated or annealed.

As shown in FIG. 1B, a further method step can subsequently be carried out. For this purpose, a mask can be applied for a further lithography step and, in particular, a third trench 12 can be produced within the second trench 7. The third trench 12 can be produced by an etching step. As a result, the current spreading structure 11 can be broken up within the second trench 7. The photoresist mask can be removed and, if appropriate, a passivation layer 13 made of silicon dioxide, for example, can be applied (not shown here).

Subsequently, as shown in FIG. 1C, a lithography step can be carried out again. The passivation layer can be etched away in regions and the metallic connection contacts, that is to say the n- and the p-connection contacts 8, 9, can be introduced into the corresponding trenches 6, 7. In the subsequent method step, the photoresist can be removed.

Figure 2:
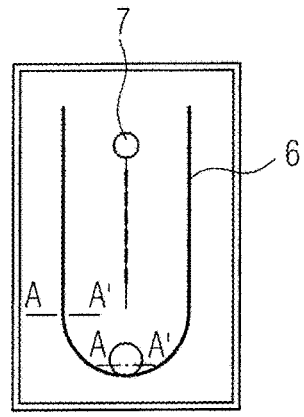
FIGS. 2A, 3A, 4A, 5A, 6A to 6D, 9A, 9B and 10A each show a plan view of an optoelectronic component according to an example.
FIGS. 2B, 3B, 4B, 5B, 7A to 7C, 8A to 8C and 10B each show a schematic side view of an optoelectronic component according to an example.
FIGS. 2C, 3C, 4C and 5C in each case show an FIB-image of the side view of an optoelectronic semiconductor chip in accordance with an example.
Figure 2:
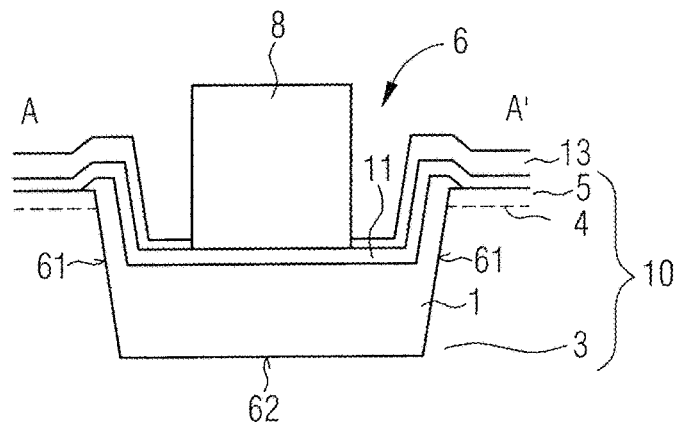
Figure 2:
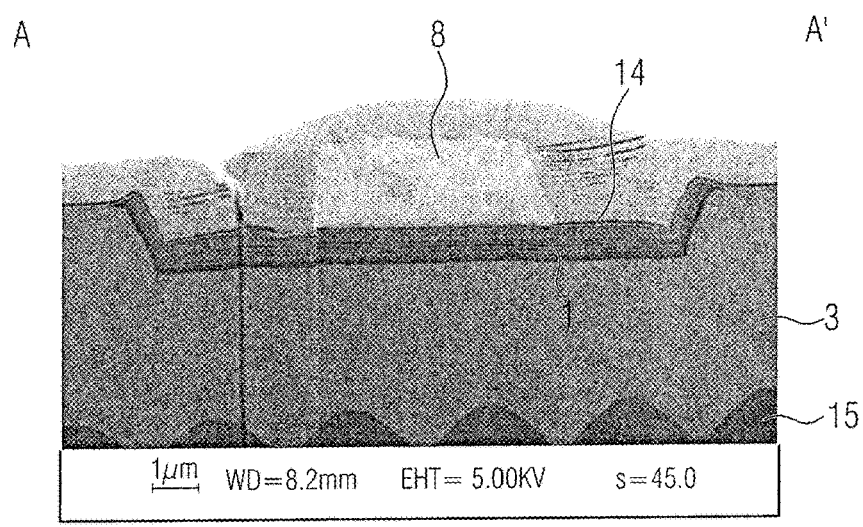

FIGS. 2A to 2C show an optoelectronic semiconductor chip according to an example. FIG. 2A shows the plan view of the optoelectronic semiconductor chip, FIG. 2B shows the schematic side view in the sectional view AA', and FIG. 2C shows an FIB-image (focused ion beam) according to the schematic side view of FIG. 2B.

FIG. 2B shows a semiconductor layer sequence 10 having an n-doped semiconductor layer 3, in particular of n-GaN, a p-doped semiconductor layer 5, in particular of p-GaN, and an active layer 4 arranged between the two semiconductor layers 3, 5. A first trench 6 extends within the semiconductor layer sequence; the first trench 6 extends from the p-doped semiconductor layer 5 via the active layer 4 into the n-doped semiconductor layer 3. Within the first trench 6, the first dielectric mirror element 1 is arranged. The first dielectric mirror element 1 completely covers the side surfaces 61 and the base surface 62 of the first trench 6. A current spreading structure 11 is arranged above the first dielectric mirror element 1. The current spreading structure 11 extends over the side faces 61 and the base area 62 of the first trench 6. The current spreading structure 11 can preferably be formed from ITO. Optionally, a passivation layer 13, for example, made of silicon dioxide, can be arranged above the current spreading structure 11. The p-connection contact is arranged within the first trench. The p-connection contact 8 is directly applied, in particular, on the current spreading structure 11. The p-connection contact 8 can extend in a side view exclusively within the first trench 6. As an alternative, as shown here, the p-connection contact 8 can also project beyond the first trench 6.

FIG. 2C shows an FIB-image with a substrate 15, which is, for example, a structured sapphire substrate, an n-doped semiconductor layer 3, a first dielectric mirror element 1, a sacrificial layer 14 and a p-type connection contact 8.

Figure 3:
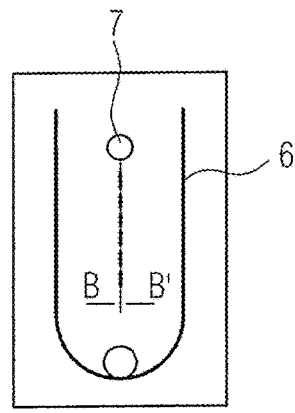
Figure 3:
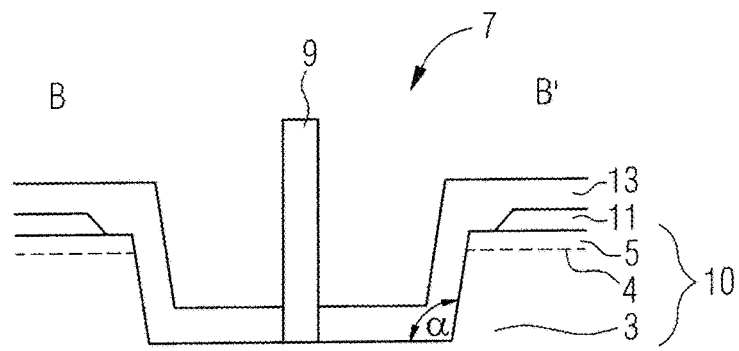
Figure 3:
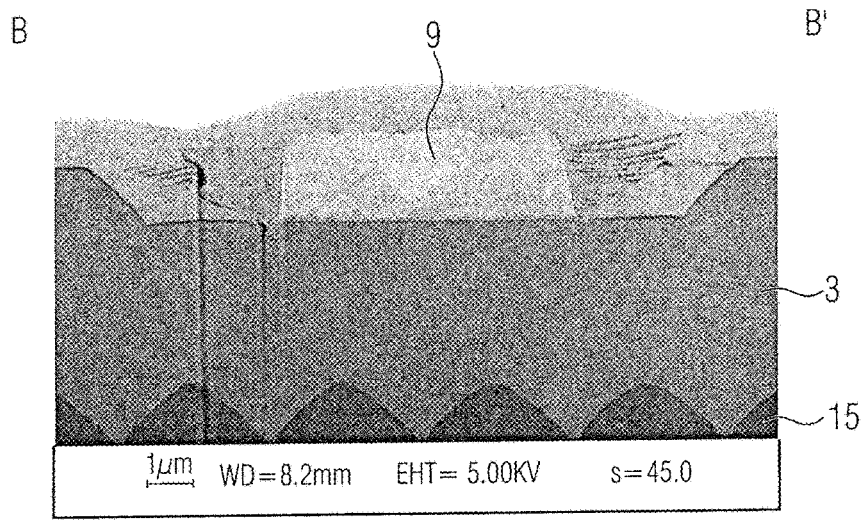

FIGS. 3A to 3C show an optoelectronic semiconductor chip according to an example.

FIG. 3A shows a plan view of an optoelectronic semiconductor chip. FIG. 3B shows a sectional area representation BB' of the optoelectronic semiconductor chip, and FIG. 3C shows an FIB-image.

The semiconductor chip 100 comprises a semiconductor layer sequence 10 comprising an n-doped semiconductor layer 3, an active layer 4 and a p-doped semiconductor layer 5.

As shown in FIG. 3B, the semiconductor layer has a second trench 7 extending into the n-doped semiconductor layer 3. A passivation layer, for example, made of silicon dioxide is optionally arranged within the second trench 7. In addition, an n-connection contact is arranged, which is in direct electrical and/or mechanical contact with the n-doped semiconductor layer 3.

The component can additionally have a current spreading structure 11 that is preferably not arranged within the second trench 7. The current spreading structure 11 can be made of ITO.

Figure 4:
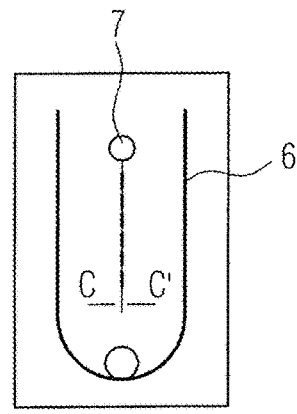
Figure 4:
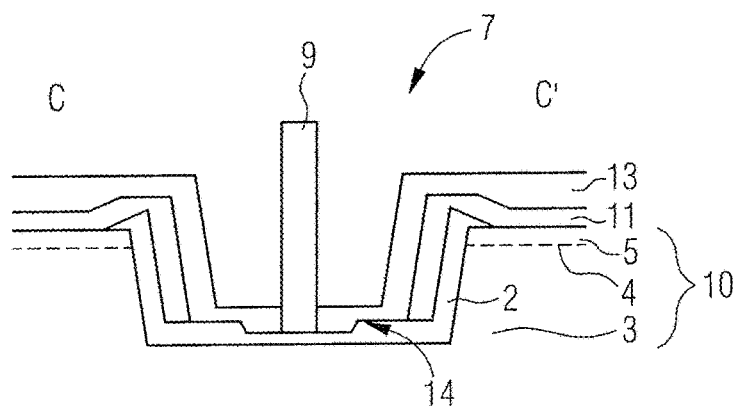
Figure 4:
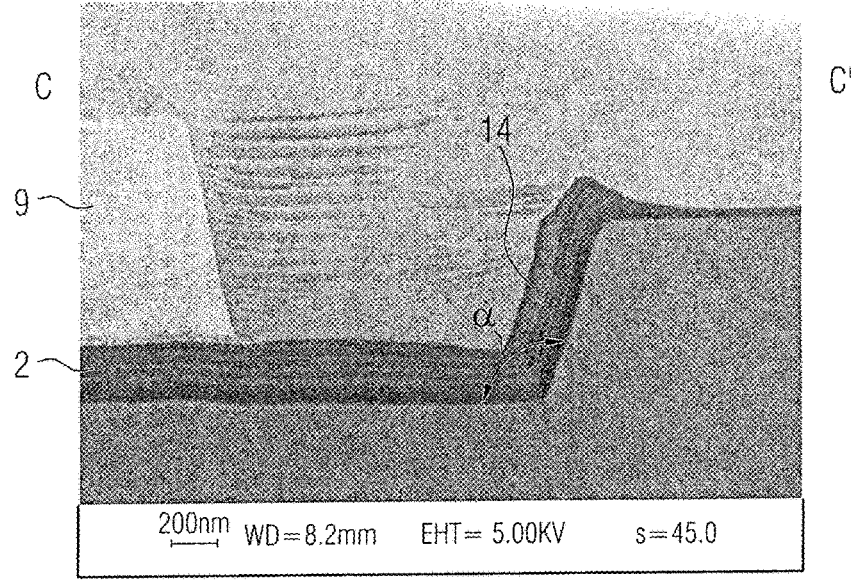

FIGS. 4A to 4C show an optoelectronic semiconductor chip according to an example. FIG. 4B shows a sectional area illustration CC' of the optoelectronic component of FIG. 4A.

The side view of FIG. 4B differs from the side view of FIG. 3B in that the second dielectric mirror element 2 is arranged within the second trench 7 in FIG. 4B. Preferably, the second dielectric mirror element 2 is formed as a DBR. The second dielectric mirror element 2 has a layer sequence. The n-connection contact 9 is arranged on the dielectric mirror element. In particular, below the n-connection contact, the layer thickness of the second dielectric mirror element 2 is smaller than at the edges within the second trench 7 of the second dielectric mirror element 2. In other words, the layer thickness of the second dielectric mirror element 2 is removed during production in the region below the n-connection contact 9. Preferably, the second dielectric mirror element 2 is formed as a layer sequence so that the topmost terminal layer of the second dielectric mirror element 2, here also referred to as the sacrificial layer 14, can be removed. The semiconductor chip 100 can additionally have a current spreading structure 11 and a passivation layer 13.

FIG. 4C shows an FIB-image having a second dielectric mirror element 2, an n-connection contact 9 and the sacrificial layer 14. The sacrificial layer is part of the second dielectric mirror element 2. In particular, the sacrificial layer 14 forms the end layer of the second dielectric mirror element 2.

Figure 5:
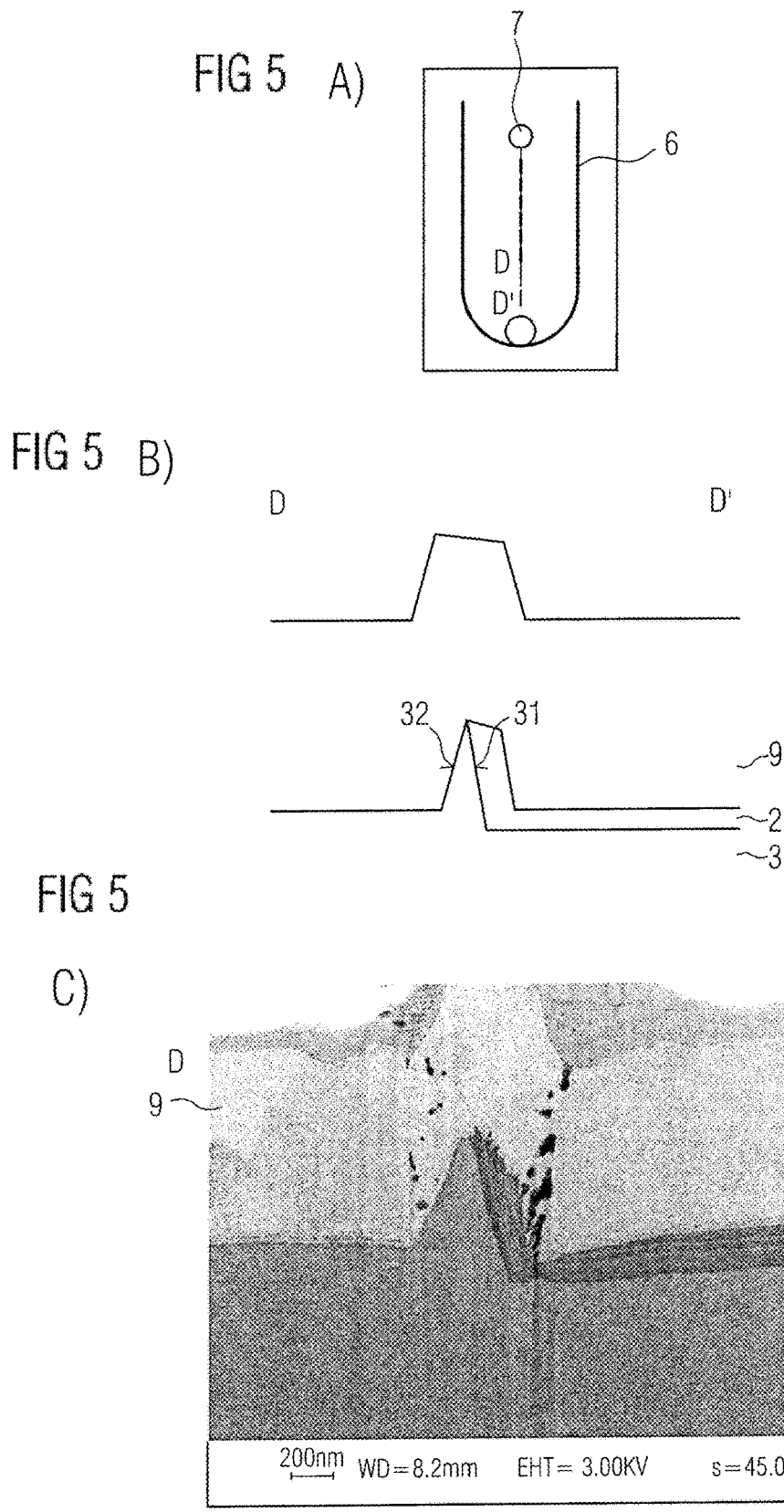

FIGS. 5A to 5C show an optoelectronic semiconductor chip according to an example. FIG. 5A shows a plan view of a semiconductor chip 100 according to an example, the section DD' is shown in FIG. 5B. FIG. 5C shows an FIB-image according to the example.

FIG. 5B shows the formation of the n-doped semiconductor layer 3 within the second trench 7 as a so-called pitched roof. Viewed in the lateral cross section, the n-doped semiconductor layer 3 is thus shaped in a triangular manner in this region. The pitched roof-shaped configuration of the n-doped semiconductor layer 3 has side faces 31 and 32. The one side surface 31 of the pitched roof-shaped configuration is covered with the second dielectric mirror element 2. Preferably, the second side surface 32 is not covered with the dielectric mirror element 2. The second side surface 32 can be in direct mechanical and/or electrical contact with the n-connection contact 9. The second dielectric mirror element is preferably arranged between the first side face 31 and the n-connection contact 9.

As an alternative to FIG. 5B, the second trench 7 can be formed as a pitched roof and, viewed in the lateral cross section, the n-doped semiconductor layer 3 is trapezoidal and non-triangular in this region as shown in FIG. 5B. One side of the trapezoid may be covered with the second dielectric mirror element 2.

In addition, FIG. 5C shows black regions above the one side surface 31 and the second side surface 32. These black regions here represent holes in the material generated by a rollover of the pitched roof-shaped configuration.

In addition, FIG. 5C shows the pitched roof-shaped or pyramid-shaped configuration of the n-doped semiconductor layer.

Figure 6:
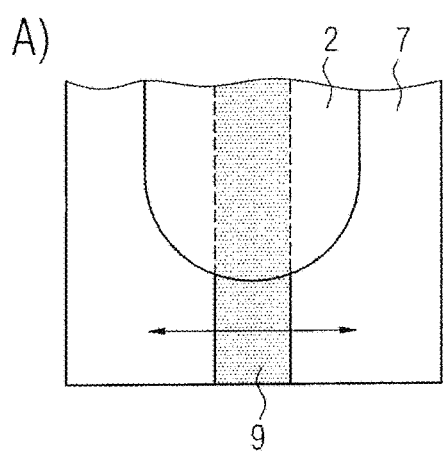
Figure 6:
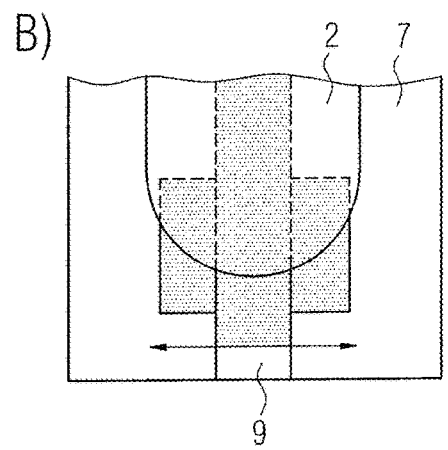
Figure 6:
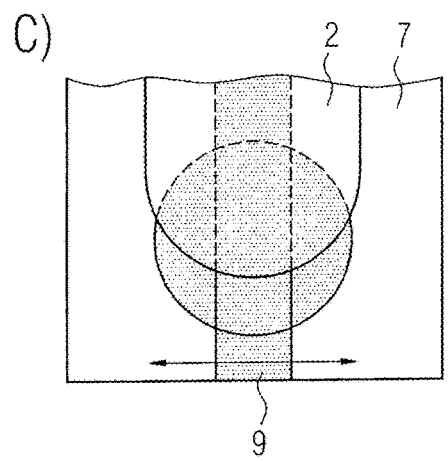
Figure 6:
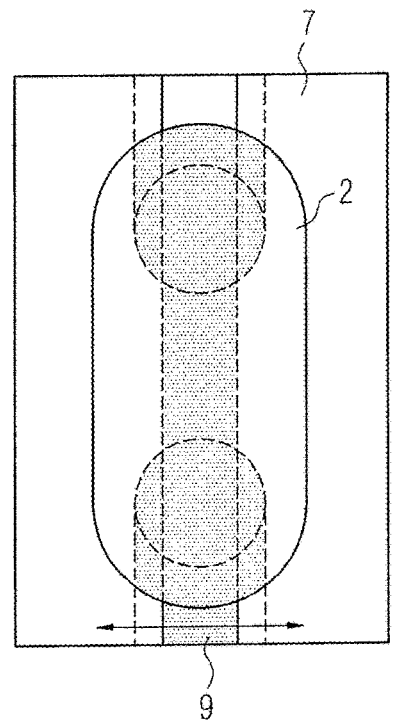

FIGS. 6A to 6D show a plan view of a second trench 7 of an optoelectronic semiconductor chip 100. Different variations of the n-connection contact 9 are shown. The n-connection contact 9 can have a smaller lateral extent when viewed in a plan view than the second dielectric mirror element (FIG. 6A).

FIG. 6B shows that the n-connection contact 9 can be formed in a rectangular shape and can have an approximately equal lateral extent as the second dielectric mirror element 2.

FIG. 6C shows a round configuration of the n-connection contact 9 superimposed on the second dielectric mirror element 2 at least in partial regions. The second dielectric mirror element 2 and the n-connection contact 9 can have the same lateral extent.

Instead of a bracing of the n-connection contact in the region of the pitched roofs, the latter can also be tapered above the second dielectric mirror element (FIG. 6D).

Figure 7:
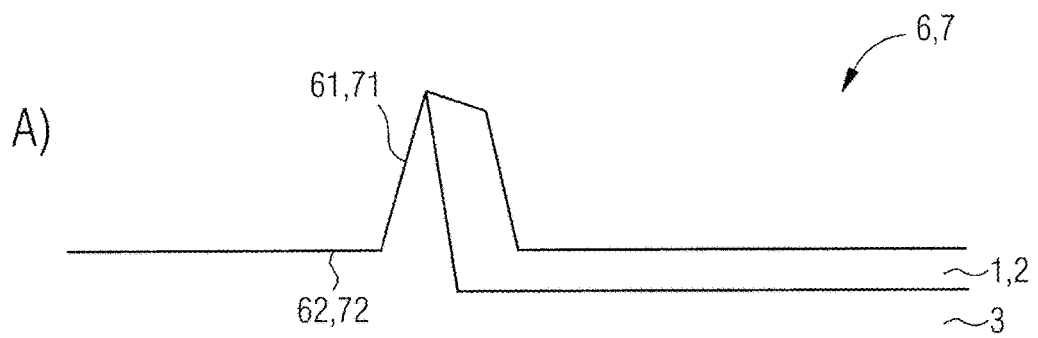
Figure 7:
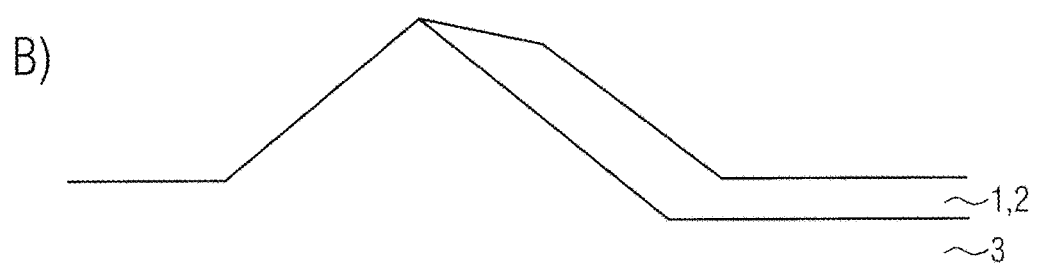
Figure 7:
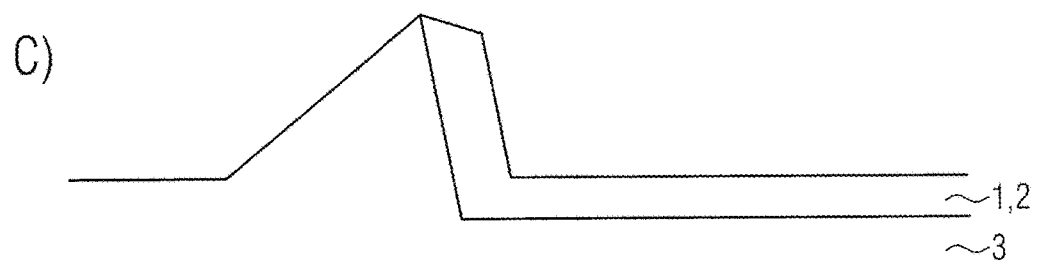

FIGS. 7A to 7C show a schematic side view of a different variation of the configuration of the first and second trenches 6, 7. In this case, the first and/or second trench/es 6, 7 can form an angle between the base area 62, 72 and at least one side surface 61, 71 of greater than 110°, preferably greater than 115°, preferably greater than 120°. In other words, the trenches can have a differently strong inclination of the side surfaces with respect to the base surface.

The pitched roof-shaped configuration can thus be different.

Figure 8:
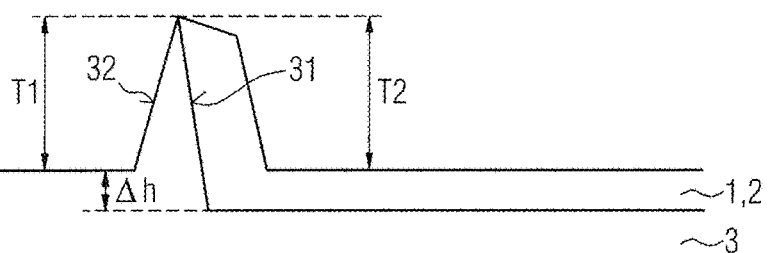
Figure 8:
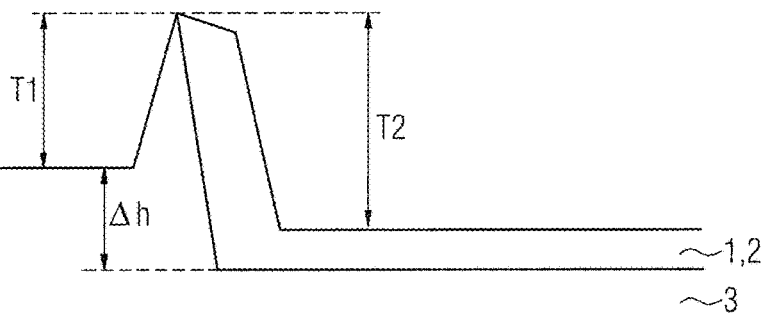
Figure 8:
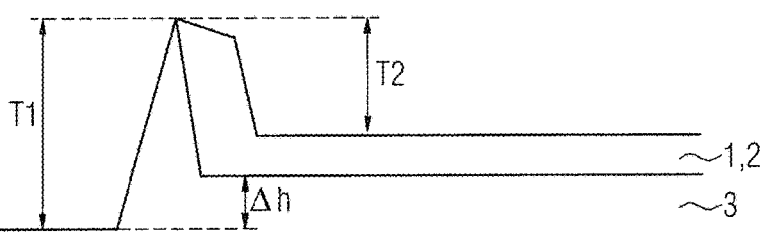

FIGS. 8A to 8C show a different configuration of the first and second trenches 6, 7. In particular, the trenches have a different layer height of the n-doped semiconductor layer 3 to the left of the pitched roof-shaped configuration and to the right of the pitched roof-shaped configuration. A different layer height results in a different side surface 31, 32. In other words, the side surface 32 is smaller than the side surface 31; in particular, on the side surface 31, i.e., to the right of the pitched roof-shaped configuration, the first or second dielectric mirror element is arranged. The height of the n-doped semiconductor layer 3 to the left of the pitched roof-shaped configuration and to the right of the pitched roof-shaped configuration can have a difference Δh of 0 to 6000 nm, in particular 200 nm to 900 nm, particularly preferably 500 nm to 900 nm.

FIG. 8A shows a Δh of 0, FIG. 8B shows a Δh of up to 2 μm and FIG. 8C shows a Δh of 300 nm. FIGS. 8A to 8C show different trench heights T1, T2. In FIG. 8A, the height T1 of the first recess is identical to the height of the second recess T2, that is to say on the left-hand side and on the right-hand side of the pitched roof-shaped configuration, while the second dielectric mirror element 2 is additionally applied in the second recess on the right-hand side.

FIG. 8B shows T1<T2. FIG. 8C shows T2<T1.

Figure 9:
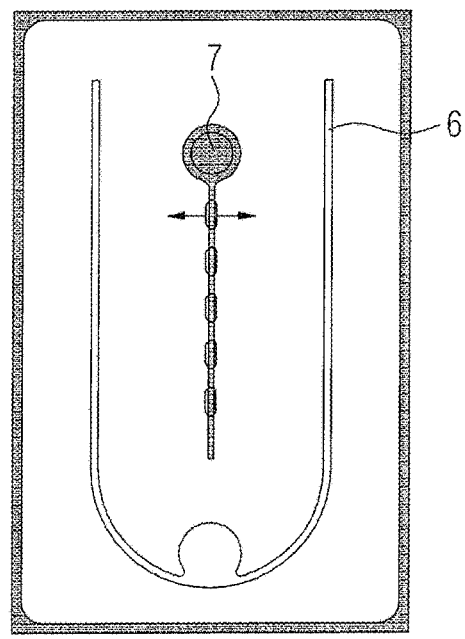
Figure 9:
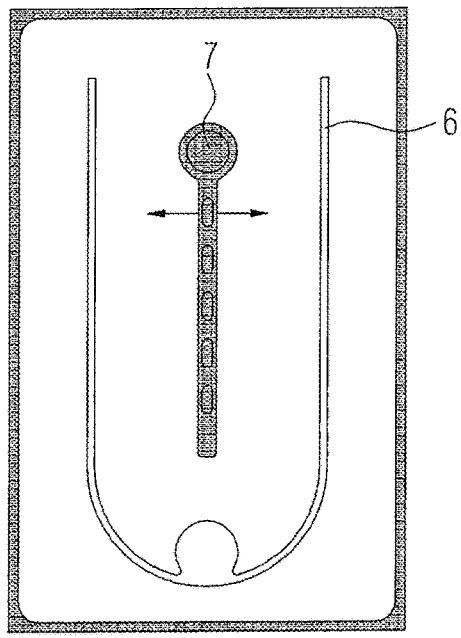

FIGS. 9A and 9B each show a plan view of an optoelectronic semiconductor chip according to an example. In FIG. 9A, the second trench 7 is formed smaller than the lateral extent of the second dielectric mirror element 2.

In FIG. 9B, the lateral extent is vice versa. In other words, in FIG. 9B, the lateral extent of the second dielectric mirror element 2 is greater than the lateral extent of the second trench 7.

Figure 10:
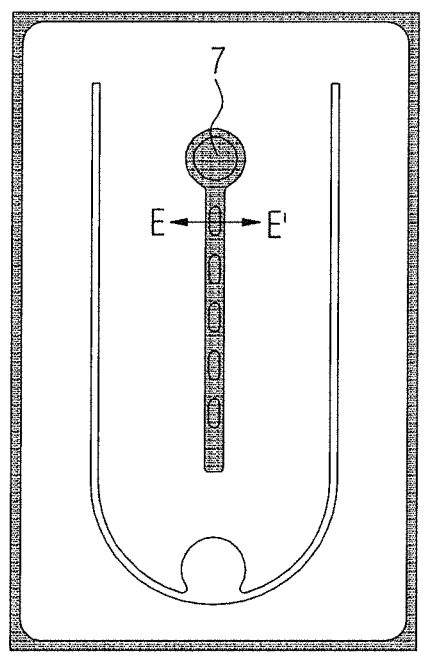
Figure 10:
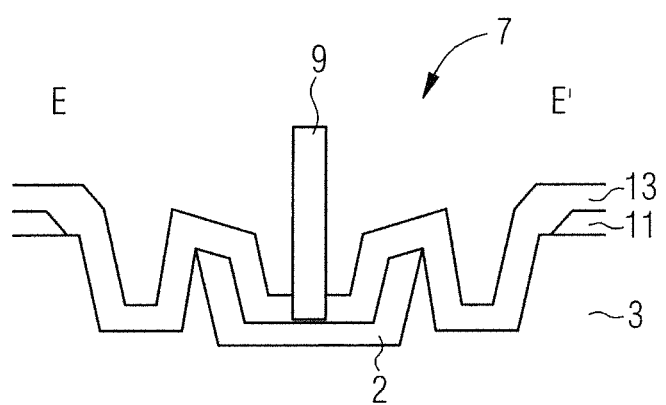

FIGS. 10A and 10B show a schematic plan view and side view of an optoelectronic semiconductor chip according to an example.

FIG. 10B shows a sectional view EE', which is shown in the top view of FIG. 10A. FIG. 10B shows an n-doped semiconductor layer sequence 3, a current spreading structure 11 and a passivation layer 13 arranged thereon; the second dielectric mirror element 2 is arranged within the second trench 7. Preferably, as shown in FIG. 10B, the second trench 7 has a greater lateral extent than the second dielectric mirror element 2. In particular, two pitched configurations within the trenches are produced, which are laterally arranged adjacent to the n-connection contact 9.

In addition, the passivation layer 13 can extend within the second trench, which is, for example, made from silicon dioxide, and the n-connection contact 9 can be arranged on the second dielectric mirror element 2. The current spreading structure 11 can extend outside the second trench 7 and/or within the second trench 7.

In summary, the sectional representation AA' shows a section through the first trench 6, in which the p-connection contact 8 is arranged. The sectional representation BB' shows a section through the second trench 7 having the n-connection contact 9 without the second dielectric mirror element 2. The n-connection contact 9 is in direct contact with the n-doped semiconductor layer 3. In addition, a passivation layer 13 made of silicon dioxide can be present, which has been opened again after application of the whole area. The n-connection contact 9 can then be introduced into this opening. The sectional view CC' shows a section through the second trench 7 having the n-connection contact 9 and the second dielectric mirror element 2. In addition, a sacrificial layer 14 can be present, which can be removed again by etching. In addition, a current spreading structure 11 can be provided, which can be removed laterally by wet-chemical etching. In this case, the lateral etching depends on the etching time. The sectional illustration DD' shows the transition of the second trench 7 formed in the form of a zebra. The first recess is covered by the second dielectric mirror element 2. A so-called mesa pyramid can be seen at the transition. The height of the pyramid depends on the etching depth and on the angle between the base surface and the side surface of the second trench.

The n-connection contact 9 can form the mesa pyramid or the pitched-roof-shaped arrangement. The height of the n-connection contact 9 is preferably higher than the depth of the corresponding recesses. As shown in the FIB-images, in the region of the pitched roof-shaped configuration, small holes are disadvantageously shown in the region of the n-connection contact 9. This results from the overforming of the n-connection contact via the pyramid-shaped configuration. The holes in the n-connection contact 9 increase the sheet resistance and thus the voltage distribution of the n-connection contact 9. To compensate for this effect, the proportion of the n-connection contact can be increased and thus the surface resistance can be reduced. This can be achieved, for example, by the examples of FIGS. 6A to 6D. FIG. 6A shows the reference with a constant width of the n-connection contact close to the transition between the mesa trenches and the second dielectric mirror element 2. FIGS. 6B and 6C show one rectangular configuration or round configuration of the n-connection contact 9. In addition, the width of the n-connection contact on the second dielectric mirror element can be reduced (FIG. 6D). Alternatively, the thickness of the n-connection contact can be increased and thus the current distribution cross section can be increased.

The examples described in conjunction with the figures and the features thereof can also be combined with one another in accordance with further examples, even if such combinations are not explicitly shown in the figures. Furthermore, the examples described in conjunction with the figures can have additional or alternative features according to the description in the general part.

Our chips and methods are not restricted to the examples by the description. Rather, this disclosure encompasses any new feature and also any combination of features, which includes the combination of features in the appended claims, even if the feature or combination itself is not explicitly specified in the claims or examples.

This application claims priority of DE 10 2017 106 915.1, the subject matter of which is incorporated herein by reference.

The invention claimed is:

1. An optoelectronic semiconductor chip comprising:
a semiconductor layer sequence comprising at least one n-doped semiconductor layer, at least one p-doped semiconductor layer, an active layer arranged between the at least one n-doped semiconductor layer and the at least one p-doped semiconductor layer,
wherein the p-doped semiconductor layer is electrically contacted by a p-connection contact,
the n-doped semiconductor layer is electrically contacted by an n-connection contact,
the semiconductor chip has at least two trenches,
the p-connection contact is located within the first trench and the n-connection contact is located within the second trench,
below the p-connection contact and within the first trench a first dielectric mirror element is arranged, which is electrically insulated, and
a second dielectric mirror element that is electrically insulating is arranged at least in regions below the n-connection contact and within the second trench and between the n-connection contact and the n-doped semiconductor layer such that the n-connection contact is not in electrical contact with the n-doped semiconductor layer within the regions.

2. The optoelectronic semiconductor chip according to claim 1, wherein a current spreading structure is arranged between the p-connection contact and the first dielectric mirror element.

3. The optoelectronic semiconductor chip according to claim 1, wherein the first dielectric mirror element and the current spreading structure are each formed as a layer and completely cover, viewed in a lateral cross-section, both the side surfaces as well as the base area of the first trench, and at least the layer of the first dielectric mirror element has a homogeneous layer thickness in at least one region.

4. The optoelectronic semiconductor chip according to claim 1, wherein the second dielectric mirror element is formed as a layer and completely covers, viewed in a lateral cross-section, both the side surfaces and the base surface of the second trench, and the layer thickness of the layer of the second dielectric mirror element in the region below the n-connection contact and on the base surface is smaller than the layer thickness of the layer of the second dielectric mirror element on the side surfaces of the second trench.

5. The optoelectronic semiconductor chip according to claim 1, wherein the n-doped semiconductor layer has a roof shape within the second trench and has a triangular shape when viewed in a lateral cross-section, and a side surface of the roof configuration is covered with the second dielectric mirror element.

6. The optoelectronic semiconductor chip according to claim 5, wherein the side surface covered with the second dielectric mirror element of the roof configuration is larger than the further side face of the roof-shaped configuration.

7. The optoelectronic semiconductor chip according to claim 1, wherein the first and/or second trench/es have/has an angle between the base area and at least one side surface of greater than 110°.

8. The optoelectronic semiconductor chip according to claim 1, wherein the first and/or second trench/es have/has an angle between the base area and at least one side surface of greater than 120°.

9. The optoelectronic semiconductor chip according to claim 1, wherein the first dielectric minor element and/or the second dielectric mirror element have/has at least three layers having at least one first dielectric layer made of a first dielectric material having a refractive index n1 and at least one second dielectric layer made of a second dielectric material having a refractive index n2>n1.

10. The optoelectronic semiconductor chip according to claim 1, wherein the first dielectric mirror element and/or the second dielectric mirror element comprise/s at least one material selected from the group consisting of $Al_2O_3$, $Ta_2O_5$, $ZrO_2$, ZnO, $SiN_x$, $SiO_xN_y$, $SiO_2$, $TiO_2$, $ZrO_2$, $HfO_2$, $Nb_2O_5$, or $MgF_2$ and combinations thereof.

11. The optoelectronic semiconductor chip according to claim 1, wherein the first dielectric mirror element and/or the second dielectric mirror element have/has a layer sequence with alternating layers of $SiO_2$ and $TiO_2$.

12. The optoelectronic semiconductor chip according to claim 1, wherein the first dielectric mirror element and/or the second dielectric mirror element have/has the same material.

13. The optoelectronic semiconductor chip according to claim 1, wherein, by the first dielectric mirror element or the second dielectric mirror element, a direct current flow between the p-connection contact or n-connection contact and the p- and n-doped semiconductor layers and the active layer is prevented.

14. A method of producing the optoelectronic semiconductor chip according to claim 1 comprising:
   A) providing a semiconductor layer sequence with trenches comprising at least one n-doped semiconductor layer, at least one p-doped semiconductor layer and an active layer arranged between the at least one n-doped semiconductor layer and the at least one p-doped semiconductor layer, wherein the first trench designed contains a first dielectric mirror element and a p-connection contact, and the second trench designed contains a second dielectric mirror element and an n-connection contact,
   B) applying the first and second dielectric mirror elements and a current spreading structure into the first and second trenches by lithography,
   C) at least partially removing the current spreading structure within the second trench, and
   D) applying the p-connection contact in the first trench and the n-connection contact into the second trench.

15. The method according to claim 14, wherein a further, third trench is produced within the second trench by step C).

* * * * *